United States Patent
Cremers

(10) Patent No.: US 10,791,294 B2
(45) Date of Patent: Sep. 29, 2020

(54) IMAGE SENSORS HAVING CAPACITIVELY COUPLED PIXELS

(71) Applicant: SEMICONDUCTOR COMPONENTS INDUSTRIES, LLC, Phoenix, AZ (US)

(72) Inventor: Bart Cremers, Zonhoven (BE)

(73) Assignee: SEMICONDUCTOR COMPONENTS INDUSTRIES, LLC, Phoenix, AZ (US)

(\*) Notice: Subject to any disclaimer, the term of this patent is extended or adjusted under 35 U.S.C. 154(b) by 11 days.

(21) Appl. No.: 16/226,791

(22) Filed: Dec. 20, 2018

(65) Prior Publication Data

US 2020/0204750 A1    Jun. 25, 2020

(51) Int. Cl.
*H04N 5/378* (2011.01)
*H01L 27/146* (2006.01)
*H04N 5/3745* (2011.01)

(52) U.S. Cl.
CPC ....... *H04N 5/378* (2013.01); *H01L 27/14645* (2013.01); *H04N 5/37452* (2013.01); *H04N 5/37457* (2013.01)

(58) Field of Classification Search
CPC ............... H04N 5/378; H04N 5/37457; H04N 5/37452; H01L 27/14645

USPC ........ 348/294–324; 250/208.1; 257/290–292
See application file for complete search history.

(56) References Cited

U.S. PATENT DOCUMENTS

| | | |
|---|---|---|
| 2010/0097501 A1 | 4/2010 | Fowler |
| 2010/0271517 A1 | 10/2010 | De Wit et al. |
| 2015/0029376 A1\* | 1/2015 | Sugawa ............... H04N 5/378 |
| | | 348/308 |
| 2016/0044296 A1 | 2/2016 | Sun et al. |

\* cited by examiner

*Primary Examiner* — Yogesh K Aggarwal
(74) *Attorney, Agent, or Firm* — Treyz Law Group, P.C.; Tianyi He

(57) ABSTRACT

An image sensor pixel may include a photodiode, a floating diffusion, and a transfer gate. Column readout circuitry coupled to the image sensor pixel via a column line. The image sensor pixel may have a pixel output path that is capacitive coupled to the column line via a capacitor. An input terminal of the capacitor at the image sensor pixel may be coupled to a pre-charging transistor. The pre-charging transistor may connect the input terminal of the capacitor to a grounding voltage. During readout operations, the pre-charging transistor may be activated before a row select transistor is activated to read out reset or image level signals. By capacitively coupling the image sensor pixel to the column line, pixel signal readout operations such as signal readout speed may be improved while pixel power may be reduced.

17 Claims, 5 Drawing Sheets

IMAGE SENSORS HAVING CAPACITIVELY COUPLED PIXELS

BACKGROUND

This relates generally to imaging devices, and more particularly, to image pixels and readout circuitry in imaging devices.

Image sensors are commonly used in electronic devices such as cellular telephones, cameras, and computers to capture images. In a typical arrangement, an electronic device is provided with an array of image pixels arranged in pixel rows and pixel columns. The image pixels each contains a photodiode for generating charge in response to light (e.g., by photoelectric conversion). Circuitry is commonly coupled to each pixel column for reading out signals from the image pixels using a corresponding column line.

In general, the image pixels in each pixel column is directly coupled to the column line. However, in large pixel arrays where the column lines are long and each column line is coupled to a large number of pixels, image readout speed is limited by parasitic resistance and capacitance of the column line. These undesirable parasitic properties scale with increasing array size and increasingly limits image readout speeds.

It would therefore be desirable to provide imaging systems with improved image readout speeds.

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds or thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
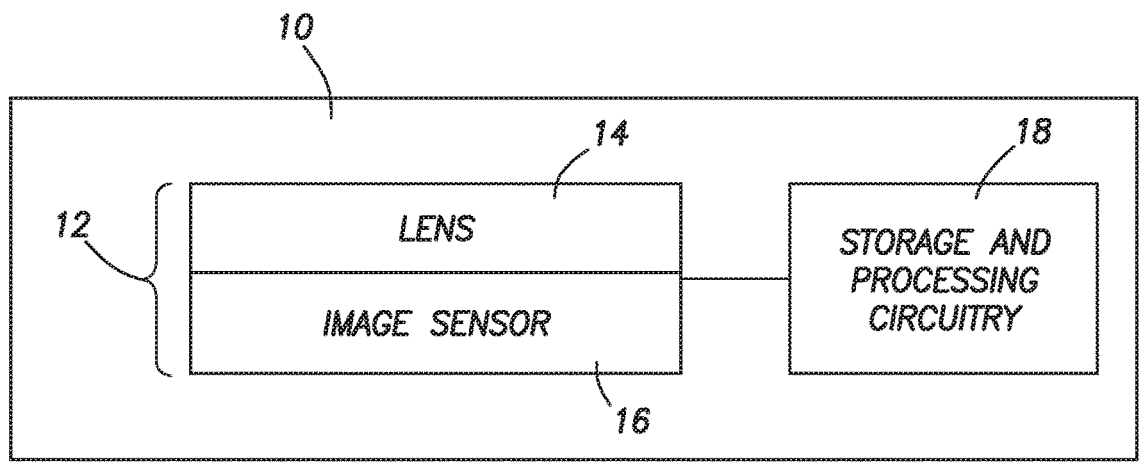
FIG. 1 is a diagram of an illustrative electronic device having an image sensor and processing circuitry for capturing images using a pixel array in accordance with some embodiments.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data. Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel data into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18.

Figure 2:
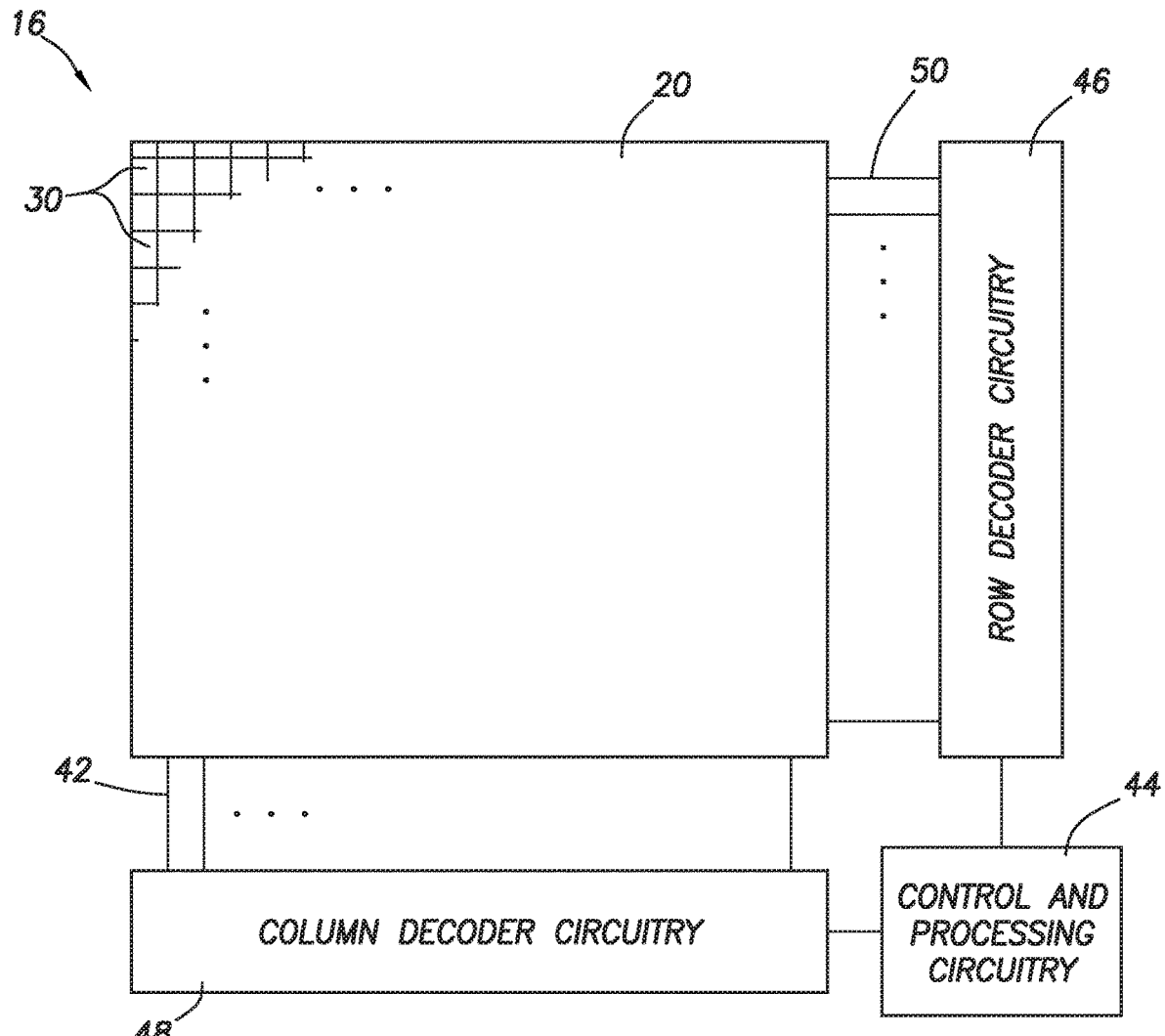
FIG. 2 is a diagram of an illustrative pixel array and associated readout circuitry for reading out image signals from the pixel array in accordance with some embodiments.

As shown in FIG. 2, image sensor 16 may include a pixel array 20 containing image sensor pixels 30 (sometimes referred to herein as image pixels or pixels) arranged in rows and columns and control and processing circuitry 44 (which may include, for example, image signal processing circuitry). Array 20 may contain, for example, hundreds or thousands of rows and columns of image sensor pixels 30. Control circuitry 44 may be coupled to row control circuitry 46 (sometimes referred to herein as row decoder circuitry or row circuitry) and column readout circuitry 48 (sometimes referred to herein as column control circuitry, readout circuitry, processing circuitry, or column decoder circuitry). Row control circuitry 46 may receive row addresses from control circuitry 44 and supply corresponding row control signals such as reset, row-select, charge transfer, dual conversion gain, and readout control signals to pixels 30 over row control lines 50. One or more conductive lines such as column lines 42 may be coupled to each column of pixels 30 in array 20. Column lines 42 may be used for reading out image signals from pixels 30 and for supplying bias signals (e.g., bias currents or bias voltages) to pixels 30. If desired, during pixel readout operations, a pixel row in array 20 may be selected using row control circuitry 46 and image signals generated by image pixels 30 in that pixel row can be read out along column lines 42.

Image readout circuitry 48 may receive image signals (e.g., analog pixel values generated by pixels 30) over column lines 42. Image readout circuitry 48 may include sample and hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 30 and for reading out image signals from pixels 30. ADC circuitry in readout circuitry 48 may convert analog pixel values received from array 20 into corresponding digital pixel values (sometimes referred to as digital image data or digital pixel data). Image readout circuitry 48 may supply digital pixel data to control and processing circuitry 44 and/or processor 18 (FIG. 1) for pixels in one or more pixel columns.

If desired, a color filter array may be formed over photosensitive regions in array 20 so that a desired color filter element in the color filter array is formed over an upper surface of the photosensitive region of an associated pixel 30. A microlens may be formed over an upper surface of the color filter array to focus incoming light onto the photosensitive region associated with that pixel 30. Incoming light may be focused onto the photosensitive region by the microlens and may pass through the color filter element so that only light of a corresponding color is captured at the photosensitive region. If desired, an optional masking layer may be interposed between the color filter element and the microlens for one or more pixels 30 in array 20. In another suitable arrangement, an optional masking layer may be interposed between the color filter element and the photosensitive region for one or more pixels 30 in array 20. The masking layers may include metal masking layers or other filtering layers that block a portion of the image light from being received at the photosensitive region. If desired, image pixels 30 may be formed without any masking layers.

If desired, pixels 30 in array 20 of FIG. 2 may be provided with an array of color filter elements that each pass one or more colors of light. All or some of pixels 30 may be provided with a color filter element. Color filter elements for pixels 30 may be red color filter elements (e.g., photoresist material that passes red light while reflecting and/or absorbing other colors of light), blue color filter elements (e.g., photoresist material that passes blue light while reflecting and/or absorbing other colors of light), and/or green color filter elements (e.g., photoresist material that passes green light while reflecting and/or absorbing other colors of light). Color filter elements may also be configured to filter light that is outside the visible human spectrum. For example, color filter elements may only allow infrared light or ultraviolet light to reach the photodiode. Color filter elements may configure image pixel 30 to only detect light of a certain wavelength or range of wavelengths and may be configured to allow multiple wavelengths of light to pass while blocking light of certain other wavelengths (for example, light having a wavelength that corresponds to a certain visible color and/or an infrared or ultraviolet wavelength).

Color filter elements that pass two or more colors of light (e.g., two or more colors of light selected from the group that includes red light, blue light, and green light) are sometimes referred to herein as "broadband" filter elements. For example, yellow color filter elements that are configured to pass red and green light and clear color filter elements that are configured to pass red, green, and blue light may be referred to herein as broadband filter elements or broadband color filter elements. Similarly, image pixels that include a broadband color filter element (e.g., a yellow, magenta, or clear color filter element) and that are therefore sensitive to two or more colors of light (e.g., that capture image signals in response to detecting two or more colors of light selected from the group that includes red light, blue light, and green light) may sometimes be referred to herein as broadband pixels or broadband image pixels. As an example, image sensor pixels such as the image pixels in array 20 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. These examples are merely illustrative and, if desired, color filter elements of any suitable color and in any suitable pattern may be formed over any suitable number of image pixels 30.

Figure 3:
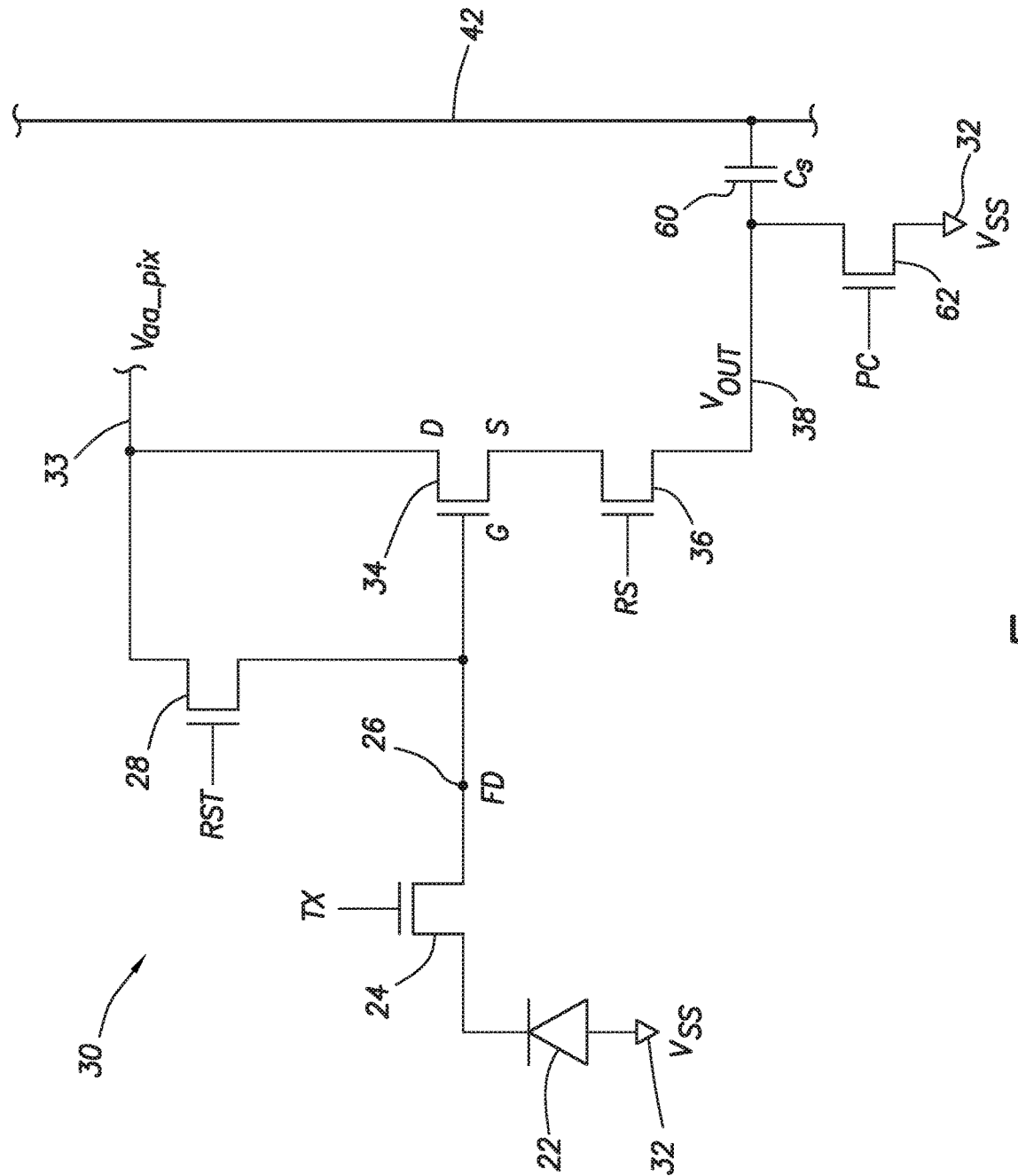
FIG. 3 is a schematic diagram of an illustrative image sensor pixel that is capacitively coupled to a column line in accordance with some embodiments.

Circuitry in an illustrative image pixel 30 of image pixel array 20 is shown in FIG. 3. As shown in FIG. 3, pixel 30 may include a photosensitive element such as photodiode 22 (sometimes referred to herein as photodetector 22). A positive pixel power supply voltage (e.g., voltage Vaa_pix) may be supplied at positive power supply terminal 33. A ground power supply voltage (e.g., $V_{SS}$) may be supplied at ground power supply terminal 32. Incoming light may be gathered by photodiode 22 after passing through a color filter structure. Photodiode 22 may convert the light to electrical charge. Photodiode 22 may be reset to a reset voltage (e.g., a positive power supply voltage) before image acquisition.

Additionally, before an image is acquired, reset control signal RST may be asserted (e.g., asserted-high to activate a corresponding transistor). This turns on reset transistor 28 and resets charge storage node 26 (also referred to as floating diffusion FD or floating diffusion region FD) to a reset voltage level (e.g., a voltage level equal or close to voltage level Vaa_pix). The reset control signal RST may then be deasserted (e.g., asserted-low to deactivate a corresponding transistor) to turn off reset transistor 28. After the reset process is complete, transfer gate control signal TX may be asserted to turn on transfer transistor (transfer gate) 24. When transfer transistor 24 is turned on, the charge that has been generated by photodiode 22 in response to incoming light is transferred to charge storage node 26.

Charge storage node 26 may be implemented using a region of doped semiconductor (e.g., a doped silicon region formed in a silicon substrate by ion implantation, impurity diffusion, or other doping techniques). The doped semiconductor region (i.e., the floating diffusion FD) may exhibit a capacitance that can be used to store the charge that has been transferred from photodiode 22. The signal associated with the stored charge on node 26 may be buffered by source-follower transistor 34. Row select transistor 36 may connect the source follower transistor 34 to column output line 42.

If desired, other types of image pixel circuitry may be used to implement the image pixels of image sensor 16. For example, each image sensor pixel 30 (see, e.g., FIG. 1) may be a three-transistor pixel, a pinned-photodiode pixel with four transistors, a global shutter pixel, a rolling shutter pixel, a pixel with light-flickering mitigation capabilities and/or charge overflow capabilities, etc. The circuitry of FIG. 3 is merely illustrative.

When it is desired to read out the value of the stored charge (i.e., the value of the stored charge that is represented by the signal at the source S of transistor 34), row select control signal RS can be asserted. When control signal RS is asserted, transistor 36 is turned on and a corresponding signal Vout that is representative of the magnitude of the charge on charge storage node 26 is produced on output path 38 (at a source-drain terminal opposite of the source-drain terminal to which transistor 34 is coupled). There may be numerous rows and columns of pixels such as pixel 30 in the image sensor pixel array of a given image sensor. A conductive path such as column line 42 may be associated with one column of image pixels 30. When control signal RS is asserted in a given pixel 30, column line 42 can be used to route signal Vout from the pixel 30 to readout circuitry (e.g., readout circuitry 48 in FIG. 2).

In scenarios where a pixel output path such as output path 38 is directly coupled to a corresponding column line such as column line 42, readout operations (e.g., speed of readout operations) may be limited by parasitic capacitances and resistances on column line 42. Additionally, the parasitic capacitances and resistances on column line 42 may undesirably require higher column line current and/or increased power consumption within pixels such as pixel 30.

In order to mitigate these issues associated with the parasitic properties of column line 42, output path 38 may be capacitively coupled to column line 42. In particular, capacitor 60 having capacitance $C_S$ may be interposed between output path 38 and column line 42 (e.g., may have a first (input) terminal coupled to output path 38 and a second (output) terminal coupled to column line 42). Additionally, pixel 30 may include a pre-charge transistor such as transistor 62 that couples the input terminal of capacitor 60 to a ground supply voltage terminal (e.g., terminal 32 supplying voltage $V_{SS}$). In other words, rather than using a galvanic connection to connect output path 38 to column line 42, pixel 30 may use a capacitive coupling to connect output path 38 to column line 42. By using this capacitive coupling scheme, column line 42 may have a lower impedance and experience reduced voltage swings thereon than in scenarios where a pixel (e.g., via pixel output path 38) is directly connected to column line 42. Additionally, in scenarios where pixel 30 is used to drive signals off column line 42, pixel power may be conserved in a capacitive coupling scheme, since pixel 30 needs only to charge the input terminal of coupling capacitor 60.

Figure 4:
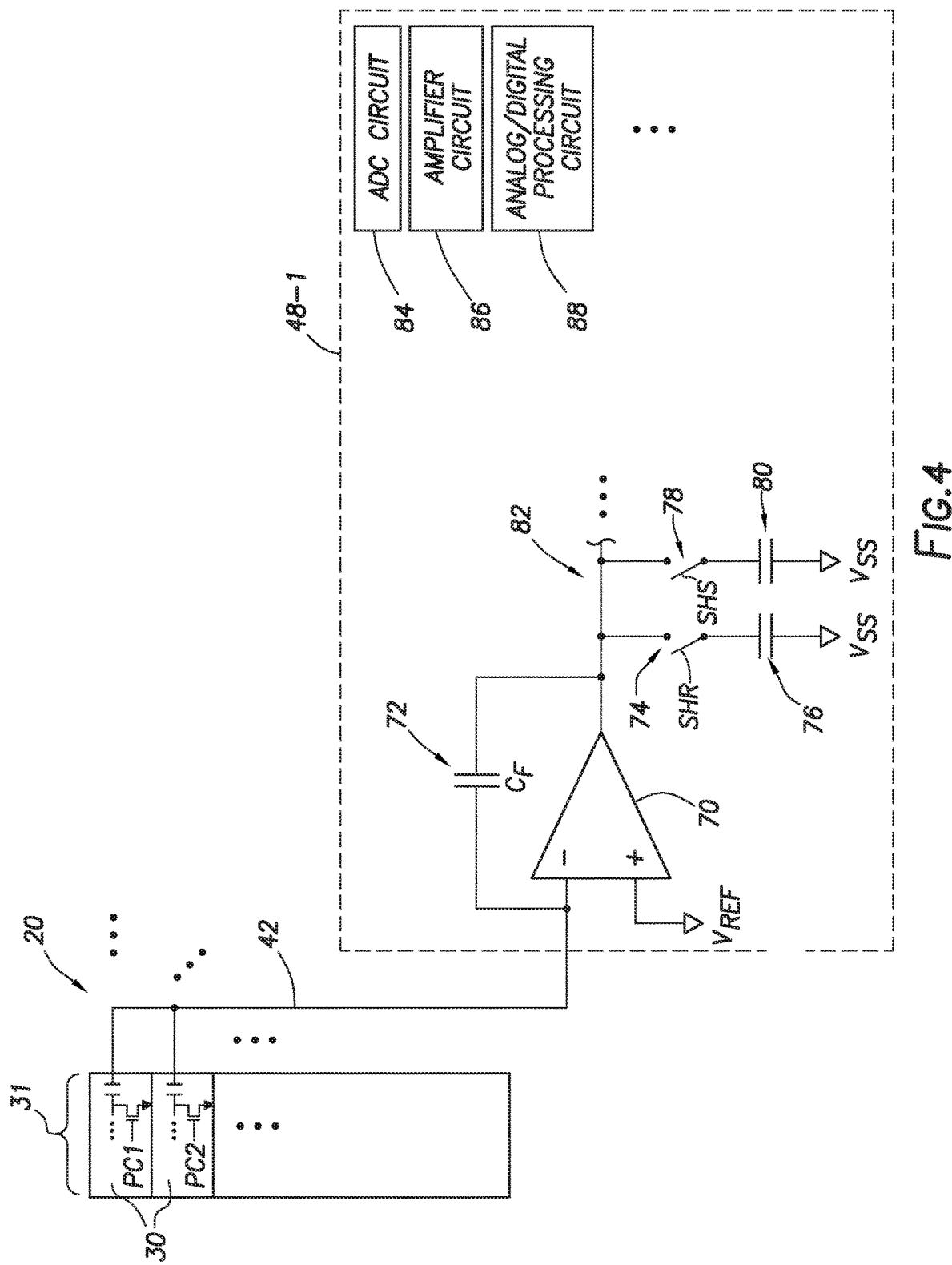
FIG. 4 is a diagram of illustrative column readout circuitry having sample and hold circuitry coupled to a column line in accordance with some embodiments.

FIG. 4 shows multiple pixels in a column of pixels capacitively coupled to a column line. In particular, pixel column 31 may include pixels 30 each having a configuration as described in connection with FIG. 3. Each pixel 30 in pixel column 31 may include a coupling capacitor (e.g., capacitor 60 in FIG. 3) that couples a respective pixel output path (e.g., pixel output path 38 in FIG. 3) to column line 42.

As an example, pixel output signals (e.g., charge stored on column line 42) may be conveyed onto readout circuit 48-1 (sometimes referred to herein as column decoder circuitry, column circuitry, or column readout circuitry). Readout circuit 48-1 may include operational amplifier 70 (sometimes referred to herein as an amplifier or an amplifier circuit) having a negative (inverting) input terminal coupled directly to column line 42 and a positive (non-inverting) input terminal coupled to a reference voltage (e.g., voltage $V_{REF}$). Operational amplifier 70 may include an output that is coupled to its negative input terminal via a feedback path. The feedback path may include feedback capacitor 72 having a capacitance $C_F$ interposed between the negative input terminal and output terminal of operational amplifier 70. The output of operational amplifier 70 may be coupled to a sample and hold capacitor for a reset level signal (e.g., capacitor 76) via a switch enabling storage of a reset level signal (e.g., switch 74). The output of operational amplifier 70 may be coupled to a sample and hold capacitor for an image level signal (e.g., capacitor 80) via a switch enabling storage of an image level signal (e.g., switch 78). Switches 74 and 78, and capacitors 76 and 80 in combination may be sometimes referred to herein as sample and hold circuitry 82.

The output of operational amplifier 70, capacitor 76, and/or capacitor 80 may be coupled to other downstream circuits in readout circuit 48-1. These downstream circuits may include analog-to-digital conversion (ADC) circuit 84, additional amplifier circuit 86, and/or analog and/or digital processing circuit 88. If desired, readout circuit 48-1 may include any other suitable circuits, such as comparison circuits, arithmetic circuits, bias circuits, etc.

In scenarios where one or more pixel output paths 38 are not capacitively coupled to column line 42, column line 42 may be coupled to operational amplifier 70 (at the inverting input terminal) by an interposing coupling capacitor. However, this may be undesirable. By moving the interposing coupling capacitor inside pixel 30 (e.g., implemented as capacitor 60 in pixel 30 as shown in FIG. 3), column line 42 may serve as a summing node for the inverting input terminal of operational amplifier 70. As such, column line 42 may exclude any current sources for driving a current off column line 42 such that charge is conserved at the summing node (e.g., on column line 42). Column line 42 may be directly connected to respective capacitors 60 in each pixel 30 of column 31, feedback capacitor 72 in readout circuit 48-1, and a transistor in amplifier 70 or, if desired, may only be directed connected to these components (e.g., respective capacitors 60 in each pixel 30 of column 31, feedback capacitor 72 in readout circuit 48-1, and the transistor in amplifier 70). By only capacitively coupling pixels to column line 42, readout operations result in lower voltage swings (e.g., faster column line voltage settling) on column line 42, and consequently resulting in faster readout speed and/or reduced pixel power.

The input of coupling capacitor 60 in each pixel 30 may be locally pre-charged to a reference voltage such as ground supply voltage $V_{SS}$ (using transistor 62) before the given pixel 30 performs readout operations. The other pixels 30 in the same column that are not being read out may deactivate their corresponding transistors 62 to make the input of their corresponding coupling capacitors 60 floating and to avoid contributing to the parasitic capacitance of column line 42.

The illustrative configurations of pixels 30 in FIG. 4 is merely illustrative. If desired, coupling capacitors 60 and pre-charging transistors 62 may be shared by more than one pixel in a given pixel column. As examples, pixel output paths of two or more transistors may be coupled to a shared coupling capacitor 60. The input terminal of the shared coupling capacitor 60 may be coupled to a shared pre-charging transistor 62. If desired, in stacked-chip or stacked-wafer configurations where photodiodes of pixels may be formed on a first wafer and readout/processing circuitry of pixels and/or column decoder circuitry may be formed on a second wafer, the summing node (e.g., the column line) may be formed from a through-silicon via connection point between the two wafers.

Figure 5:
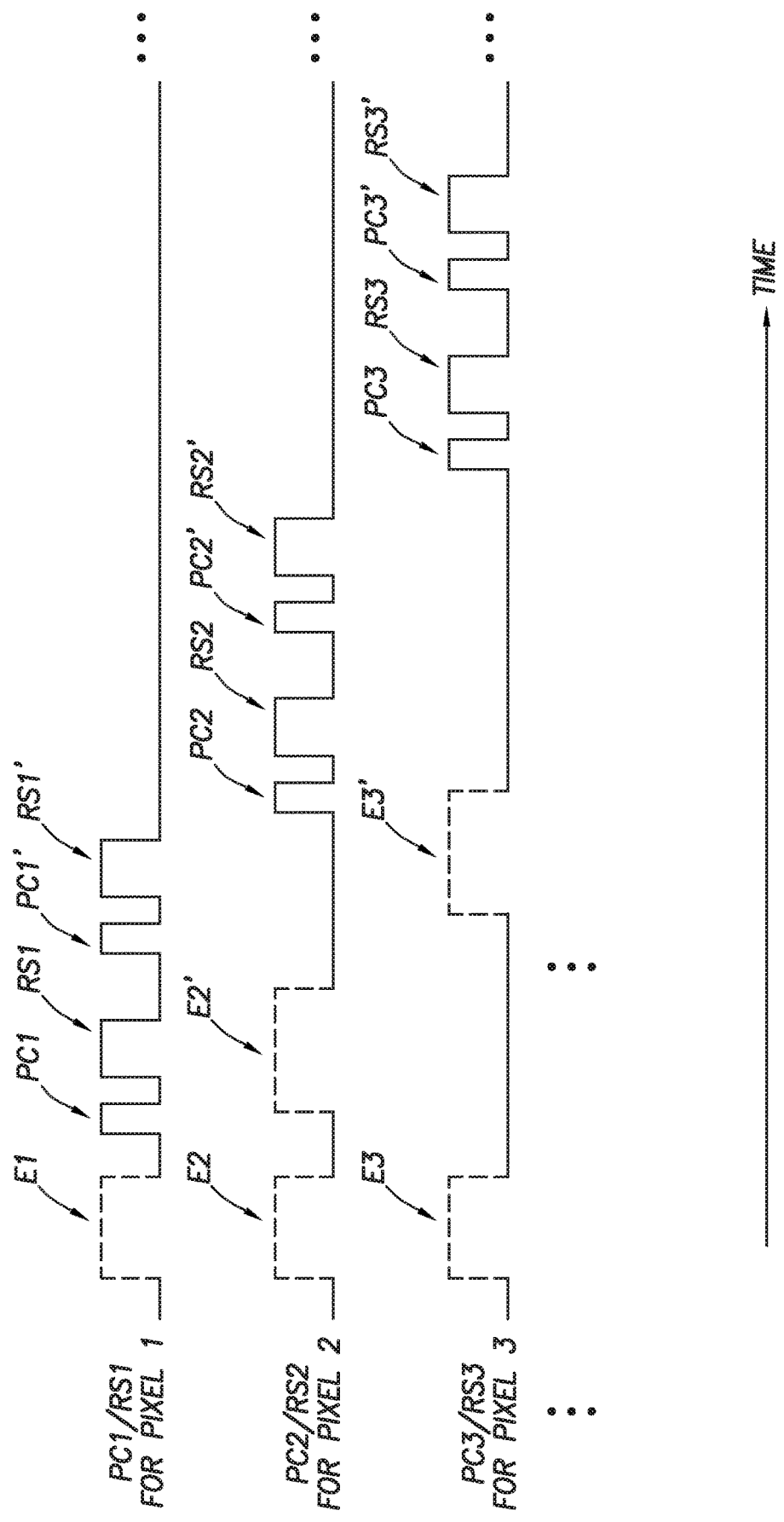
FIG. 5 is a timing diagram for operating illustrative pixels capacitively coupled to a column line in accordance with some embodiments.

FIG. 5 shows how pixels 30 in a pixel column such as pixel column 31 in FIG. 4 may operate using pre-charging and capacitive coupling during readout operations. As shown in FIG. 5, a first pixel (e.g., Pixel 1 having the same configuration as pixel 30 in FIG. 3 and/or topmost pixel 30 in column 31 in FIG. 4) in a pixel column may generate image signals during exposure time period E1. Readout operations may occur subsequent to exposure time period E1. To properly capture reset and image level signals, transistor 62 in Pixel 1 may be activated (using assertion PC1) to pre-charge the input terminal of capacitor 60 in Pixel 1 to a grounding voltage (e.g., voltage $V_{SS}$). Thereafter, transistor 36 in Pixel 1 may be activated (using assertion RS1). While transistor 36 in Pixel 1 is activated, Pixel 1 may perform a reset level signal readout. Subsequently, Pixel 1 may perform an image level signal readout by repeating assertions of control signals for transistors 62 and 36 such as assertions PC1' and RS 1', respectively (e.g., during a correlated double sampling readout). Transfer transistor 24 in Pixel 1 may be activated between assertions RS1 and RS 1' to transfer image charge to a floating diffusion region. During the readout operation of Pixel 1 (e.g., during assertions PC1 and RS1), other pixels (e.g., Pixel 2, Pixel 3, etc. in the same column) may deactivate their respective transistors 62.

Similarly, Pixel 2 (e.g., having the same configuration as pixel 30 in FIG. 3 and/or second pixel 30 from the top in column 31 in FIG. 4) in the same pixel column may generate image signals during exposure time period E2. After readout operations of Pixel 1 occurs, readout operations for Pixel 2 may occur. In particular, transistor 62 in Pixel 2 may be activated (using assertion PC2) to pre-charge the input terminal of capacitor 60 in Pixel 2 to a grounding voltage. Thereafter, transistor 36 in Pixel 2 may be activated (using assertion RS2). While transistor 36 in Pixel 2 is activated, Pixel 2 may perform a reset level signal readout and, by using assertions PC2' and RS2', an image level signal readout. Transfer transistor 24 in Pixel 2 may be activated between assertions RS2 and RS2' to transfer image charge to a floating diffusion region. Similarly, during the readout operation of Pixel 2 (e.g., during assertions PC2 and RS2), other pixels (e.g., Pixel 1, Pixel 3, etc. in the same column) may deactivate their respective transistors 62. Analogous readout operations may occur for Pixel 3, Pixel 4, etc. in the same column until all suitable signals from all pixels have been read out. In other words, pre-charging, row select, and readout operations may all occur in a rolling manner across pixels of the same column.

In an example of FIG. 5, exposure time periods for pixels (e.g., time periods E1, E2, E3, etc.) in the same column may overlap as in a global shutter mode of operation. In another example of FIG. 5, exposure time periods for pixels (e.g., time periods E1, E2', E3', etc.) in the same column may occur in a rolling manner as in a rolling shutter mode of operation. If desired, the exposure period for one pixel (e.g., Pixel 2) may overlap with readout operations for another pixel (Pixel 1) in the same column. These examples are merely illustrative.

Figure 6:
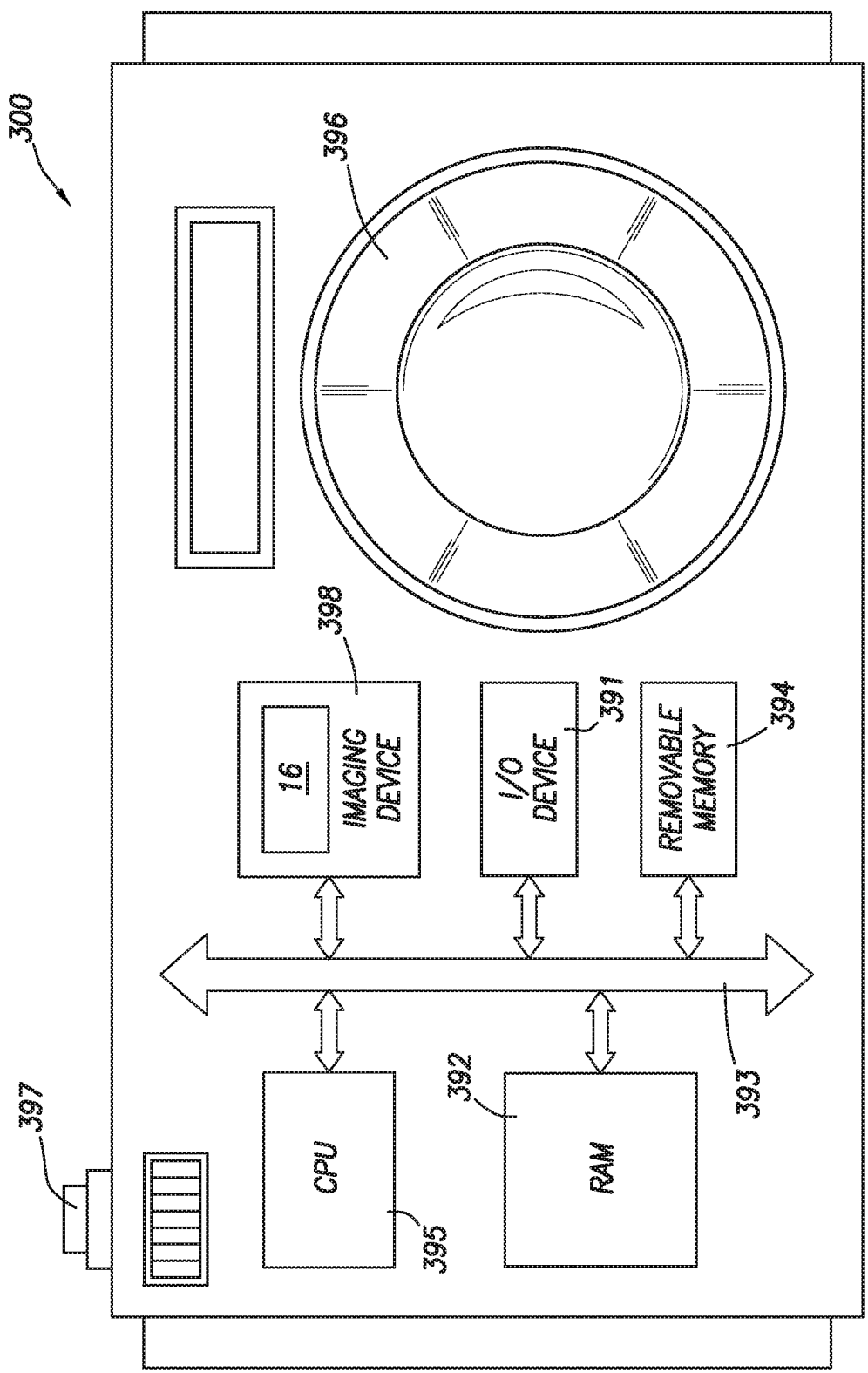
FIG. 6 is a block diagram of an illustrative image capture and processor system employing the embodiments of FIGS. 1-5 in accordance with some embodiments.

FIG. 6 shows in simplified form a typical image capture and processor system 300, such as a digital camera, which includes an imaging device 398 (e.g., an imaging device 398 such as image sensor 16 of FIGS. 1-5 employing pixels 30 in one or more pixel columns 31 capacitively coupled to one or more corresponding column lines 42). The processor system 300 is exemplary of a system having digital circuits that could include imaging device 398. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

The image capture and processor system 300 generally includes a lens 396 for focusing an image on pixel array 20 of device 398 when a shutter release button 397 is pressed, central processing unit (CPU) 395, such as a microprocessor which controls camera and one or more image flow functions, which communicates with one or more input/output (I/O) devices 391 over a bus 393. Imaging device 398 also communicates with the CPU 395 over bus 393. The system 300 also includes random access memory (RAM) 392 and can include removable memory 394, such as flash memory, which also communicates with CPU 395 over the bus 393. Imaging device 398 may be combined with the CPU, with or without memory storage on a single integrated circuit or on a different chip. Although bus 393 is illustrated as a single bus, it may be one or more busses or bridges or other communication paths used to interconnect the system components.

In various embodiments, an image sensor may include an image pixel having a row select transistor (activated during a signal readout operation of the image pixel), readout circuitry, and a signal line (e.g., a column line) that couples the image pixel to the readout circuitry (e.g., column circuitry, column readout circuitry, column decoder circuitry). The row-select transistor may be capacitively coupled to the signal line via a capacitor. In particular, the row select transistor may have a source-drain terminal (i.e., one of a source terminal or a drain terminal of a transistor) that is connected to the capacitor. A pre-charge transistor may couple the capacitor to a ground voltage terminal and may be coupled to the source-drain terminal of the row select transistor.

The readout circuitry may include an amplifier circuit (e.g., an operational amplifier) that has a first input terminal directly connected to the signal line, a second input terminal coupled to an additional reference voltage terminal, and an output terminal coupled to sample and hold circuitry. An additional capacitor may be coupled between the first input terminal and the output terminal of the amplifier circuit.

The image sensor may include an additional image pixel having an additional row select transistor. The signal line may couple the additional image pixel to the readout circuitry and the additional row select transistor is capacitively coupled to the signal line. If desired, a shared capacitor may be interposed between the row select transistor and the signal line and also interposed between the additional row select transistor and the signal line.

Additionally, the image pixel may generate an image signal in response to incident light. The pre-charge transistor may supply a grounding voltage to a terminal of the capacitor. Next, the image pixel may convey a reset level signal to the column line through the capacitor. Thereafter, the image pixel may convey the image signal to the column line through the capacitor. The column line may convey the reset level signal and the image signal to column readout circuitry.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor, comprising:
   an image pixel having a row select transistor that is activated during a signal readout operation of the image pixel;
   readout circuitry that includes an amplifier circuit; and
   a signal line that couples the image pixel to the readout circuitry, wherein the row-select transistor is capacitively coupled to the signal line, and wherein the amplifier circuit has a first input terminal coupled to the signal line and a second input terminal coupled to a reference voltage terminal.

2. The image sensor defined in claim 1, further comprising:
a capacitor having an input terminal coupled to the row select transistor and having an output terminal coupled to the signal line.

3. The image sensor defined in claim 2, wherein the row select transistor has a source-drain terminal and the input terminal of the capacitor is coupled to the source-drain terminal of the row select transistor.

4. The image sensor defined in claim 2, further comprising:
an additional transistor coupling the input terminal of the capacitor to an additional reference voltage terminal.

5. The image sensor defined in claim 1, wherein the signal line is directly connected to the first input terminal of the amplifier circuit.

6. The image sensor defined in claim 5, wherein the amplifier circuit has an output terminal that is coupled to sample and hold circuitry.

7. The image sensor defined in claim 6, wherein the first input terminal of the amplifier circuit is coupled to the output terminal of the amplifier circuit using an additional capacitor.

8. The image sensor defined in claim 1, further comprising:
an additional image pixel having an additional row select transistor that is activated during a signal readout operation of the additional image pixel, wherein the signal line couples the additional image pixel to the readout circuitry and the additional row select transistor is capacitively coupled to the signal line.

9. The image sensor defined in claim 1, further comprising:
an additional image pixel having an additional row select transistor that is activated during a signal readout operation of the additional image pixel; and
a capacitor interposed between the row select transistor and the signal line and interposed between the additional row select transistor and the signal line.

10. A method of operating an image sensor having an image pixel that is coupled to a column line using a capacitor and having a transistor coupled to the capacitor, the method comprising:
with the image pixel, generating an image signal in response to incident light;
with the image pixel, conveying the image signal to the column line through the capacitor;
conveying the image signal through the column line to column readout circuitry; and
with the transistor, supplying a grounding voltage to a terminal of the capacitor before conveying the image signal to the column line through the capacitor.

11. The method defined in claim 10, further comprising:
with the image pixel, conveying a reset level signal to the column line through the capacitor before conveying the image signal to the column line through the capacitor.

12. The method defined in claim 11, wherein supplying the grounding voltage to the terminal of the capacitor comprises supplying the grounding voltage to the terminal of the capacitor before conveying the reset level signal to the column line through the capacitor.

13. An imaging system, comprising:
a plurality of image pixels arranged in a pixel column, wherein each image pixel in the plurality of image pixels has a pixel output path; and
a column line coupling the plurality of image pixels to column circuitry, wherein each pixel output path in the plurality of image pixels is capacitively coupled to the column line, wherein the plurality of image pixels includes first and second image pixels, wherein a first capacitor couples the pixel output path of the first image pixel to the column line, and wherein a second capacitor couples the pixel output path of the second image pixel to the column line.

14. The imaging system defined in claim 13, wherein each image pixel includes a row select transistor that is capacitively coupled to the column line.

15. The imaging system defined in claim 14, wherein the first capacitor is interposed between the row select transistor of the first image pixel and the column line, and the second capacitor is interposed between the row select transistor of the second image pixel and the column line.

16. The imaging system defined in claim 15, wherein the first image pixel includes a first pre-charge transistor coupled to the first capacitor and coupled to the row select transistor of the first image pixel, and the second image pixel includes a second pre-charge transistor coupled to the second capacitor and coupled to the row select transistor of the second image pixel.

17. The imaging system defined in claim 16, wherein the first capacitor is interposed between the row select transistor in a third image pixel in the plurality of image pixels and the column line, and the row select transistor in the third image pixel is coupled to the first pre-charge transistor.

* * * * *